(12) United States Patent
Lo et al.

(10) Patent No.: US 10,388,645 B2
(45) Date of Patent: Aug. 20, 2019

(54) INTEGRATED CIRCUIT FILLER AND METHOD THEREOF

(71) Applicant: Taiwan Semiconductor Manufacturing Co., Ltd., Hsinchu (TW)

(72) Inventors: Tseng Chin Lo, Hsinchu (TW); Molly Chang, Taipei (TW); Ya-Wen Tseng, Hsinchu (TW); Chih-Ting Sun, Hsinchu County (TW); Zi-Kuan Li, Hsinchu (TW); Bo-Sen Chang, New Taipei (TW); Geng-He Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/047,827

(22) Filed: Jul. 27, 2018

(65) Prior Publication Data
US 2018/0358348 A1    Dec. 13, 2018

Related U.S. Application Data

(62) Division of application No. 15/484,628, filed on Apr. 11, 2017.

(60) Provisional application No. 62/356,964, filed on Jun. 30, 2016.

(51) Int. Cl.
*H01L 21/00*     (2006.01)
*H01L 27/02*     (2006.01)
(Continued)

(52) U.S. Cl.
CPC ...... *H01L 27/0207* (2013.01); *G06F 17/5072* (2013.01); *H01L 21/0274* (2013.01);
(Continued)

(58) Field of Classification Search
CPC ............. G06F 17/5072; H01L 27/0207; H01L 22/10–14; H01L 27/11
See application file for complete search history.

(56) References Cited

U.S. PATENT DOCUMENTS 5,869,392 A * 2/1999 Kimura ............ H01L 21/76816
                                                257/E21.577
7,782,073 B2   8/2010 Lo et al.
(Continued)

FOREIGN PATENT DOCUMENTS

CN      101276804      10/2008
TW      201611145      3/2016
WO   WO2015192069     12/2015

*Primary Examiner* — Nicholas J Tobergte
(74) *Attorney, Agent, or Firm* — Haynes and Boone, LLP

(57) ABSTRACT

Provided is a method for inserting a pre-designed filler cell, as a replacement to a standard filler cell, including identifying at least one gap among a plurality of functional cells. In some embodiments, a pre-designed filler cell is inserted within the at least one gap. By way of example, the pre-designed filler cell includes a layout design having a pattern associated with a particular failure mode. In various embodiments, a layer is patterned on a semiconductor substrate such that the pattern of the layout design is transferred to the layer on the semiconductor substrate. Thereafter, the patterned layer is inspected using an electron beam (e-beam) inspection process.

20 Claims, 7 Drawing Sheets

(51) Int. Cl.
  *G06F 17/50* (2006.01)
  *H01L 21/027* (2006.01)
  *H01L 21/8234* (2006.01)
  *H01L 27/11* (2006.01)
  *H01L 21/66* (2006.01)

(52) U.S. Cl.
  CPC .......... *H01L 21/8234* (2013.01); *H01L 22/30* (2013.01); *H01L 27/11* (2013.01); *H01L 22/10* (2013.01); *H01L 22/12* (2013.01); *H01L 22/14* (2013.01)

(56) References Cited

U.S. PATENT DOCUMENTS

| | | | |
|---|---|---|---|
| 8,601,416 B2 | 12/2013 | Kuo et al. | |
| 8,681,326 B2 | 3/2014 | Wu et al. | |
| 8,762,900 B2 | 6/2014 | Shin et al. | |
| 8,775,993 B2 | 7/2014 | Huang et al. | |
| 8,887,116 B2 | 11/2014 | Ho et al. | |
| 9,627,370 B1* | 4/2017 | Lam | G06F 17/5081 |
| 9,799,575 B2* | 10/2017 | Lam | H01L 27/11807 |
| 2009/0290401 A1* | 11/2009 | Ouyang | G11C 5/02 |
| | | | 365/51 |
| 2010/0258798 A1 | 10/2010 | Sokel et al. | |
| 2014/0101623 A1 | 4/2014 | Chen et al. | |
| 2014/0201692 A1 | 7/2014 | Chen et al. | |
| 2014/0237435 A1 | 8/2014 | Chen et al. | |
| 2014/0282337 A1 | 9/2014 | Yuh et al. | |
| 2014/0304670 A1 | 10/2014 | Su et al. | |
| 2014/0310675 A1 | 10/2014 | Liu et al. | |
| 2014/0325464 A1 | 10/2014 | Hsu et al. | |
| 2016/0092624 A1 | 3/2016 | Somayaji et al. | |

\* cited by examiner

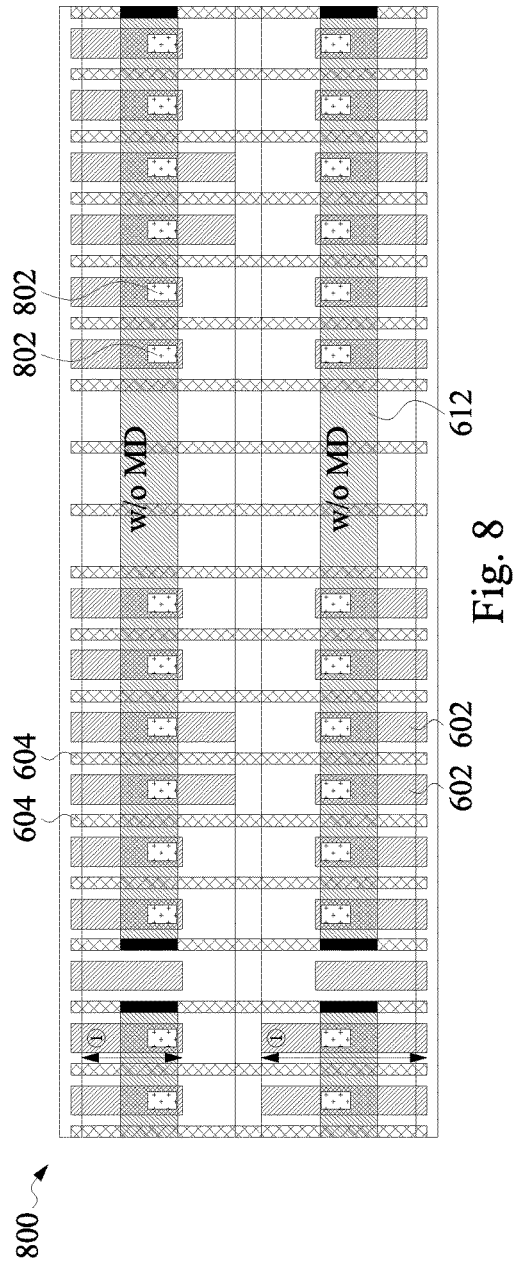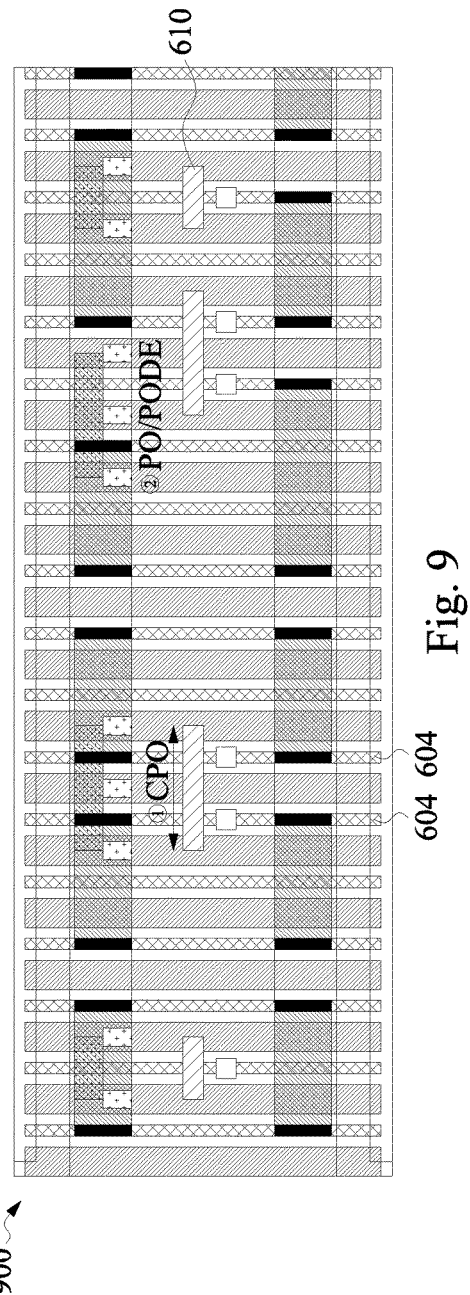

INTEGRATED CIRCUIT FILLER AND METHOD THEREOF

CROSS-REFERENCE TO RELATED APPLICATIONS

This application is a divisional application of U.S. patent application Ser. No. 15/484,628, filed Apr. 11, 2017, which claims the benefit of U.S. Provisional Application No. 62/356,964, filed Jun. 30, 2016, the disclosures of which are hereby incorporated by reference in their entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

In particular, the scaling down of IC dimensions has considerably increased the challenges associated with finding defects using existing wafer inspection methods. Wafer inspection may be subdivided into two primary technologies—optical inspection and electron beam (e-beam) inspection. While optical inspection has been a semiconductor wafer inspection workhorse for many years, e-beam inspection has gained considerable interest, particularly for its ability to detect smaller defects than those which can be detected using optical inspection. For example, e-beam inspection may provide detection of defects down to about 3 nanometers (nm), whereas optical inspection may begin to have trouble finding defects smaller than 30 nm. E-beam inspection may also be used to detect voltage-contrast type defects, such as electrical shorts or opens at a contact or an interconnect void. The benefits of e-beam inspection are evident, but there remain challenges. For example, at least some existing e-beam inspection methods suffer from low inspection sensitivity, low throughput, and/or long analysis cycle time. Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 6-10 illustrate exemplary layout designs which may be used in the redesigned filler cell, in accordance with some embodiments.

DETAILED DESCRIPTION

Figure 1:
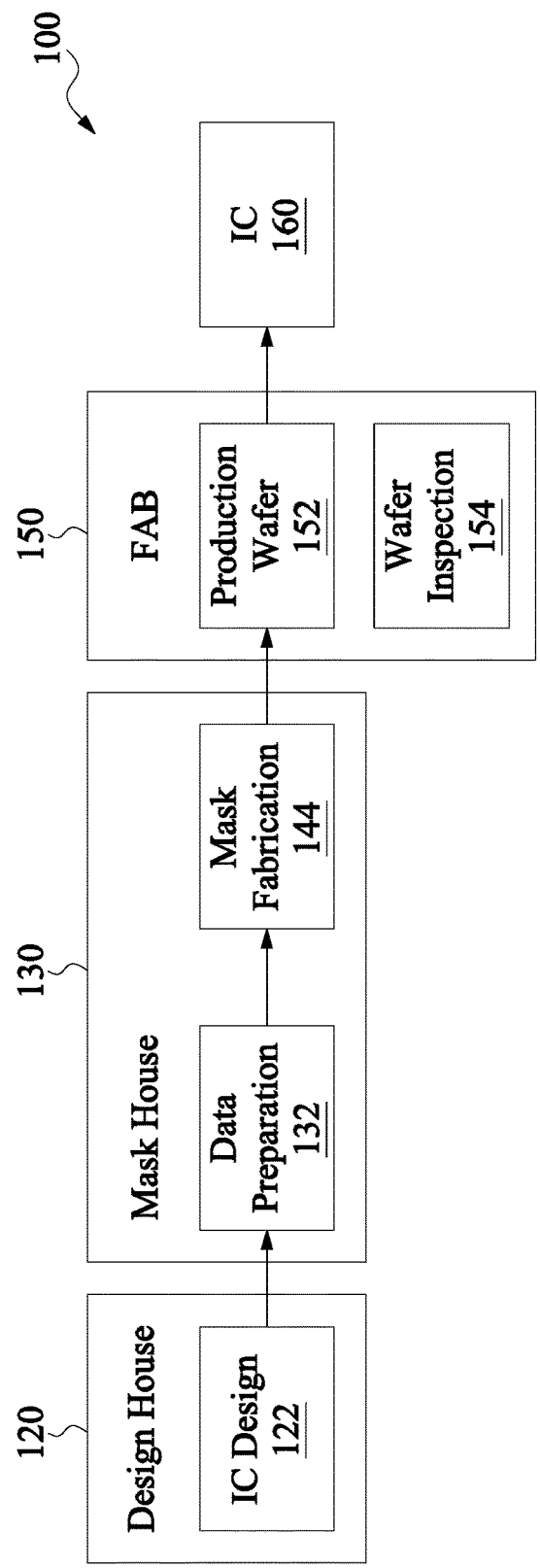
FIG. 1 is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the embodiments described herein may be employed in the design and/or fabrication of any type of integrated circuit, or portion thereof, which may comprise any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, other memory cells, or other devices as known in the art. One of ordinary skill may recognize other embodiments of semiconductor devices and/or circuits, including the design and fabrication thereof, which may benefit from aspects of the present disclosure.

The present disclosure is generally related to a method of enhancing e-beam inspection methodology by employing a redesigned filler cell in a circuit layout. Thus, additional embodiments may include an integrated circuit including the redesigned filler cell. Specifically, embodiments of the present disclosure provide the redesigned filler cell, as a replacement to a standard filler cell, where the redesigned filler cell includes a systematic design of experiments (DOE) based on existing and/or potential process failure modes. In semiconductor design, standard cell methodology is a method of designing application-specific integrated circuits (ASICs) with mostly digital-logic features. Standard cell methodology is an example of design abstraction, whereby a low-level very-large-scale integration (VLSI) layout is encapsulated into an abstract logic representation (e.g., such as a NAND gate). Cell-based methodology—the general class to which standard cells belong—makes it possible for one designer to focus on the high-level (logical function) aspect of digital design, while another designer focuses on the implementation (physical) aspect. Along with semiconductor manufacturing advances, standard cell methodology has helped designers scale ASICs from comparatively simple single-function ICs (of several thousand gates), to complex multi-million gate system-on-a-chip (SoC) devices.

By way of example, a standard cell (e.g., which may be referred to as a functional cell and/or functional logic cell) is a group of transistor and interconnect structures that provides a boolean logic function (e.g., AND, OR, XOR, XNOR, inverters) or a storage function (flip-flop or latch). The simplest cells are direct representations of the elemental NAND, NOR, and XOR boolean function, although cells of much greater complexity are commonly used (e.g., such as a 2-bit full-adder, or muxed D-input flipflop).

In a standard cell layout of an integrated circuit, gaps may be created between standard cells, as it may not be possible to have 100% utilization of the layout and also due to routing congestion. Such gaps may be filled for a number of reasons, such as for N-well continuity, to improve feature uniformity across a wafer, to ensure that power and ground signals are coupled to other functional cells, to reduce issues related to semiconductor yield, as well as for a variety of other reasons. In various cases, the gaps described above may be filled using standard filler cells, which may include non-functional filler cells. As described in more detail herein, embodiments of the present disclosure are directed to a method of enhancing e-beam inspection methodology by employing a redesigned filler cell in a circuit layout, for example, to increase in-line process issue identification capability.

While wafer inspection using optical inspection techniques has been predominantly used for many years, e-beam inspection has gained considerable interest, particularly for its ability to detect smaller defects than those which can be detected using optical inspection. For example, e-beam inspection may provide detection of defects down to about 3 nanometers (nm), whereas optical inspection may begin to have trouble finding defects smaller than 30 nm. E-beam inspection may also be used to detect voltage-contrast type defects, such as electrical shorts or opens at a contact or an interconnect void. Despite the benefits of e-beam inspection, challenges remain. For example, at least some existing e-beam inspection methods suffer from low inspection sensitivity (e.g., due to global recipe tuning), low throughput (e.g., due to additional scanning/inspection time spent on healthy cells), and/or long analysis cycle time due to non-repeating inspected patterns. Embodiments of the present disclosure offer advantages over the existing art, though it is understood that other embodiments may offer different advantages, not all advantages are necessarily discussed herein, and no particular advantage is required for all embodiments. For example, at least some embodiments provide the redesigned filler cell, as a replacement to a standard filler cell, where the redesigned filler cell includes a systematic design of experiments (DOE) based on existing and/or potential process failure modes. In some examples, the standard filler cells may be replaced by the redesigned filler cells at an auto-place and route (APR) stage of a design flow. In various embodiments, the APR stage of the design flow includes a process whereby a gate-level netlist (e.g., obtained from a synthesis tool) is physically implemented in a circuit layout by placing cells and auto-routing the cells based on the connections inferred from the netlist. By employing the redesigned filler cell, embodiments of the present disclosure can convert irregular logic patterns into repeated arrays (e.g., conceptually repeated arrays), such as in the case of an SRAM chip, thereby providing a number of benefits. For example, at least some advantages include no additional cost in terms of chip utilization, improved e-beam inspection sensitivity (e.g., due to repeated arrays/patterns), increased throughput (e.g., due to no additional inspection time for healthy cells), and shorter analysis cycle time (e.g., due to cell-to-cell comparison which may more quickly provide a good/no-good cell determination). Thus, embodiments of the present disclosure provide an enhanced e-beam inspection methodology. It is understood that the disclosed advantages are merely exemplary, and additional advantages may be evident to those skilled in the art having benefit of this disclosure.

Referring now to FIG. 1, illustrated therein is a simplified block diagram of an embodiment of an integrated circuit (IC) manufacturing system 100 and an IC manufacturing flow associated therewith, which may benefit from various aspects of the present disclosure. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may have a common owner, and may even coexist in a common facility and use common resources.

In various embodiments, the design house 120, which may include one or more design teams, generates an IC design layout 122. The IC design layout 122 may include various geometrical patterns designed for the fabrication of the IC device 160. By way of example, the geometrical patterns may correspond to patterns of metal, oxide, or semiconductor layers that make up the various components of the IC device 160 to be fabricated. The various layers combine to form various features of the IC device 160. For example, various portions of the IC design layout 122 may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. Additionally, the IC design layout 122 may include the redesigned filler cell, in accordance with embodiments of the present disclosure. In various examples, the design house 120 implements a design procedure to form the IC design layout 122. The design procedure may include logic design, physical design, and/or place and route. Additional details of the design house 120 design procedure and the IC design layout 122, including the redesigned filler cell, are described in more detail below. The IC design layout 122 may be presented in one or more data files having information related to the geometrical patterns which are to be used for fabrication of the IC device 160. In some examples, the IC design layout 122 may be expressed in a GDSII file format or DFII file format.

In some embodiments, the design house 120 may transmit the IC design layout 122 to the mask house 130, for example, via the network connection described above. The mask house 130 may then use the IC design layout 122 to manufacture one or more masks, which include the redesigned filler cell, to be used for fabrication of the various layers of the IC device 160 according to the IC design layout 122. In various examples, the mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the example of FIG. 1, the mask data preparation 132 and mask fabrication 144 are illustrated as separate elements; however, in some embodiments, the mask data preparation 132 and mask fabrication 144 may be collectively referred to as mask data preparation.

In some examples, the mask data preparation 132 includes application of one or more resolution enhancement technologies (RETs) to compensate for potential lithography errors, such as those that can arise from diffraction, interference, or other process effects. In some examples, optical proximity correction (OPC) may be used to adjust line widths depending on the density of surrounding geometries, add "dog-bone" end-caps to the end of lines to prevent line end shortening, correct for electron beam (e-beam) proximity effects, or for other purposes as known in the art. For example, OPC techniques may add sub-resolution assist features (SRAFs), which for example may include adding scattering bars, serifs, and/or hammerheads to the IC design layout 122 according to optical models or rules such that, after a lithography process, a final pattern on a wafer is improved with enhanced resolution and precision. The mask data preparation 132 may also include further RETs, such as off-axis illumination (OAI), phase-shifting masks (PSM), other suitable techniques, or combinations thereof.

After mask data preparation 132 and during mask fabrication 144, a mask or a group of masks may be fabricated based on the IC design layout 122 which includes the redesigned filler cell. For example, an electron-beam (e-beam) or a mechanism of multiple e-beams is used to form a pattern on a mask (photomask or reticle) based on the IC design layout 122 including the redesigned filler cell. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 150, such as a semiconductor foundry, uses the mask (or masks) fabricated by the mask house 130 to transfer one or more mask patterns, including a redesigned filler cell pattern, onto a production wafer 152 and thus fabricate the IC device 160 on the production wafer 152. The IC manufacturer 150 may include an IC fabrication facility that may include a myriad of manufacturing facilities for the fabrication of a variety of different IC products. For example, the IC manufacturer 150 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business (e.g., research and development). In various embodiments, the semiconductor wafer (i.e., the production wafer 152) within and/or upon which the IC device 160 is fabricated may include a silicon substrate or other substrate having material layers formed thereon. Other substrate materials may include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor wafer may further include various doped regions, dielectric features, and multilevel interconnects (formed at subsequent manufacturing steps).

Moreover, the mask (or masks) may be used in a variety of processes. For example, the mask (or masks) may be used to pattern various layers, in an ion implantation process to form various doped regions in the semiconductor wafer, in an etching process to form various etching regions in the semiconductor wafer, and/or in other suitable processes. As such, the redesigned filler cell pattern may be transferred onto any of a plurality of layers (e.g., metal, insulator, etc.) of the production wafer 152 during the manufacturing process. In addition, a wafer inspection 154 facility (e.g., such as an e-beam inspection facility) of the IC manufacturer 150 may be used to inspect the production wafer 152 during various stages of processing, for example, to detect defects (e.g., such as random or systematic defects). By way of example, if the wafer inspection 154 finds a defect present on the production wafer 152, the defect may be removed (e.g., by a defect removal tool), the production wafer 152 may be reprocessed, or other appropriate processing may be performed. In accordance with embodiments of the present disclosure, use of the redesigned filler cell provides for improved e-beam inspection sensitivity, increased throughput, and shorter analysis cycle time. Thus, embodiments of the present disclosure provide an enhanced e-beam inspection methodology, thereby improving the capabilities of the wafer inspection 154 facility.

Figure 2:
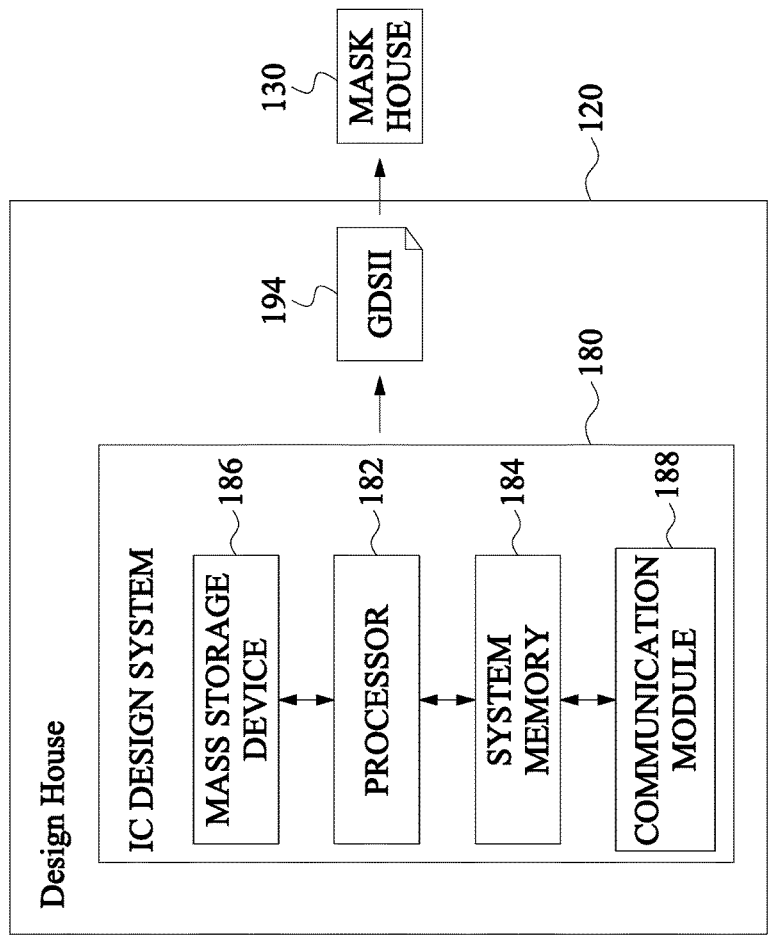
FIG. 2 is a more detailed block diagram of the design house shown in FIG. 1 according to various aspects of the present disclosure.

Referring now to FIG. 2, provided therein is a more detailed block diagram of the design house 120 shown in FIG. 1 according to various aspects of the present disclosure. In the example of FIG. 2, the design house 120 includes an IC design system 180 that is operable to perform the functionality described in association with the design house 120 of FIG. 1 and in association with methods 300, 400, and

450 of FIGS. 3/4A/4B, discussed below. The IC design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored within the mass storage device 186. Examples of mass storage devices may include hard discs, optical disks, magneto-optical discs, solid-state storage devices, and/or a variety other mass storage devices known in the art. The communication module 188 is operable to communicate information such as IC design layout files with the other components in the IC manufacturing system 100, such as mask house 130. Examples of communication modules may include Ethernet cards, 802.11 WiFi devices, cellular data radios, and/or other suitable devices known in the art.

In operation, the IC design system 180 is configured to provide the IC design layout 122, including the redesigned filler cell. In such an embodiment, the IC design system 180 provides the IC design layout 122, which may be in the form of a GDSII file 194 and which includes the redesigned filler cell, to the mask house 130. As such, the mask house 130 may use the provided IC design layout to manufacture one or more masks, which include the redesigned filler cell. In alternative embodiments, the IC design layout 122 may be transmitted between the components in the IC manufacturing system 100 in alternate file formats such as DFII, CIF, OASIS, or any other suitable file type. Further, the IC design system 180, the IC design house 120, and the mask house 130 may include additional and/or different components in alternative embodiments.

Figure 3:
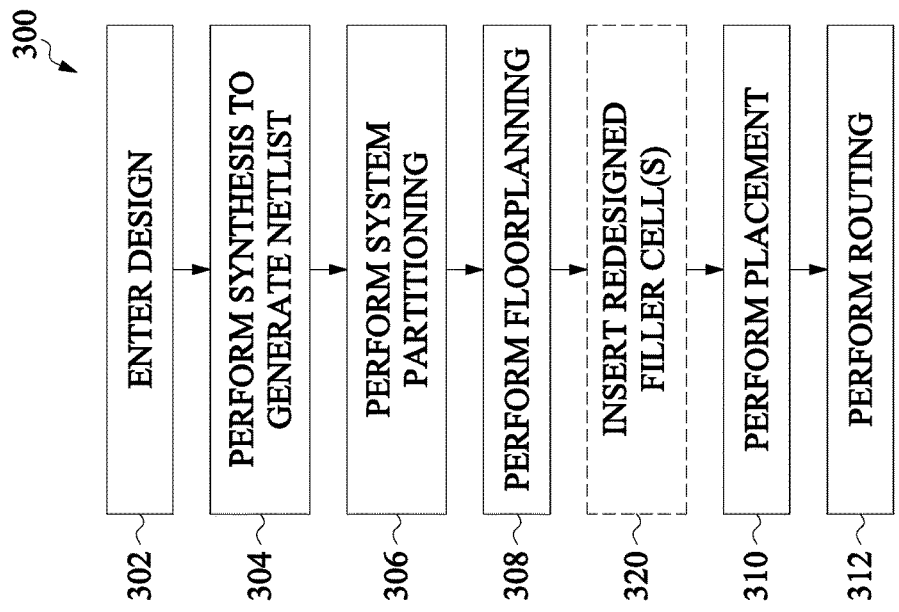
FIG. 3 shows a high-level flowchart of a method 300 of a generalized design flow, according to various aspects of the present disclosure.

Referring now to FIG. 3, illustrated therein is a flow chart of a method 300 that may be implemented by the design house 120 to provide the IC design layout 122, including the redesigned filler cell, in accordance with various embodiments. By way of example, the method 300 includes a generalized physical design flow and/or ASIC design flow. The method 300 begins at block 302 where a design is entered, for example, by way of a hardware description language (e.g., VHDL, Verilog, and/or SystemVerilog). The design entered using the hardware description language may be referred to as register transfer level (RTL) design. In some cases, functional/logical verification may be performed after the RTL design. The method 300 then proceeds to block 304 where synthesis is performed to generate a netlist (e.g., a gate-level netlist). In some examples, a synthesis tool takes the RTL hardware description and a standard cell library as inputs and generates a gate-level netlist as an output. The method proceeds to block 306 where partitioning is performed, for example, to separate various functional blocks. Thereafter, the method proceeds to block 308 where floorplanning is performed. By way of example, floorplanning is the process of identifying structures that should be placed close together, and allocating space for them in such a manner as to meet the sometimes conflicting goals of available space, required performance, and the desire to have various structures close to one another. Merely for purposes of illustration, the method 300 shows that insertion of the redesigned filler cells (block 320) may be performed immediately following the floorplanning step (block 308). To be sure, and as discussed below, insertion of the redesigned filler cells (block 320) may be performed before, after, or during any of the steps of the method 300. As such, the block 320 of the method 300 is illustrated using a dashed line. The method 300 may then proceed to block 310 where placement is performed. Placement may be used to assign locations to various circuit components on a chip. In various examples, placement may aim to optimize a total wirelength, timing, congestion, power, as well as to accomplish other objectives. The method may then proceed to block 312 where routing is performed. Routing is used to add wiring (e.g., electrical connections) between the previously placed components while satisfying IC design rules. Additional operations can be provided before, during, and after the method 300, and some operations described can be replaced, eliminated, or moved around for additional embodiments of the method. For example, the method 300 may also include clock-tree synthesis, physical verification, timing analysis, GDSII generation, or other suitable steps. It is also noted that the method 300 is exemplary, and is not intended to limit the present disclosure beyond what is explicitly recited in the claims that follow.

As previously described, gaps may be created between standard cells of an IC design layout (e.g., the IC design layout 122), as it may not be possible to have 100% utilization of the layout and also due to routing congestion. In at least some existing methods, a non-used or standard filler cell may be used to fill in these gaps. In embodiments of the present disclosure, such standard filler cells may be replaced by a pre-designed cell (e.g., the redesigned filler cell discussed above), for example, to increase in-line e-beam inspection sensitivity. In various embodiments, the redesigned filler cell includes a systematic design of experiments (DOE) based on existing and/or potential process failure modes, for example, for a given material layer, for a given section of the IC layout, for a given device or set of devices, etc. As discussed above and in some cases, the standard filler cells are replaced by the redesigned cells after the floor planning step (block 308) and before the placement step (block 310) of the method 300. Alternatively, in some examples, the standard filler cells may be replaced by the redesigned cells as part of the placement step (block 310). In some embodiments, the standard filler cells may not be placed, then replaced, by the redesigned cells, but instead the redesigned cells may be placed straightaway at a point in the design (e.g., the method 300) when the standard filler cell would have normally been placed. Generally, as previously discussed, the redesigned filler cell(s) may be placed before, after, or during any of the steps of the method 300. In some examples, a layout design that includes the standard filler cells may be redesigned such that the standard filler cells are removed and replaced by the redesigned cells. Regardless of when the redesigned filler cell(s) are inserted into the IC layout design, the present disclosure provides one or more methods for such insertion, as described in more detail below.

Figures 4A, 4B:
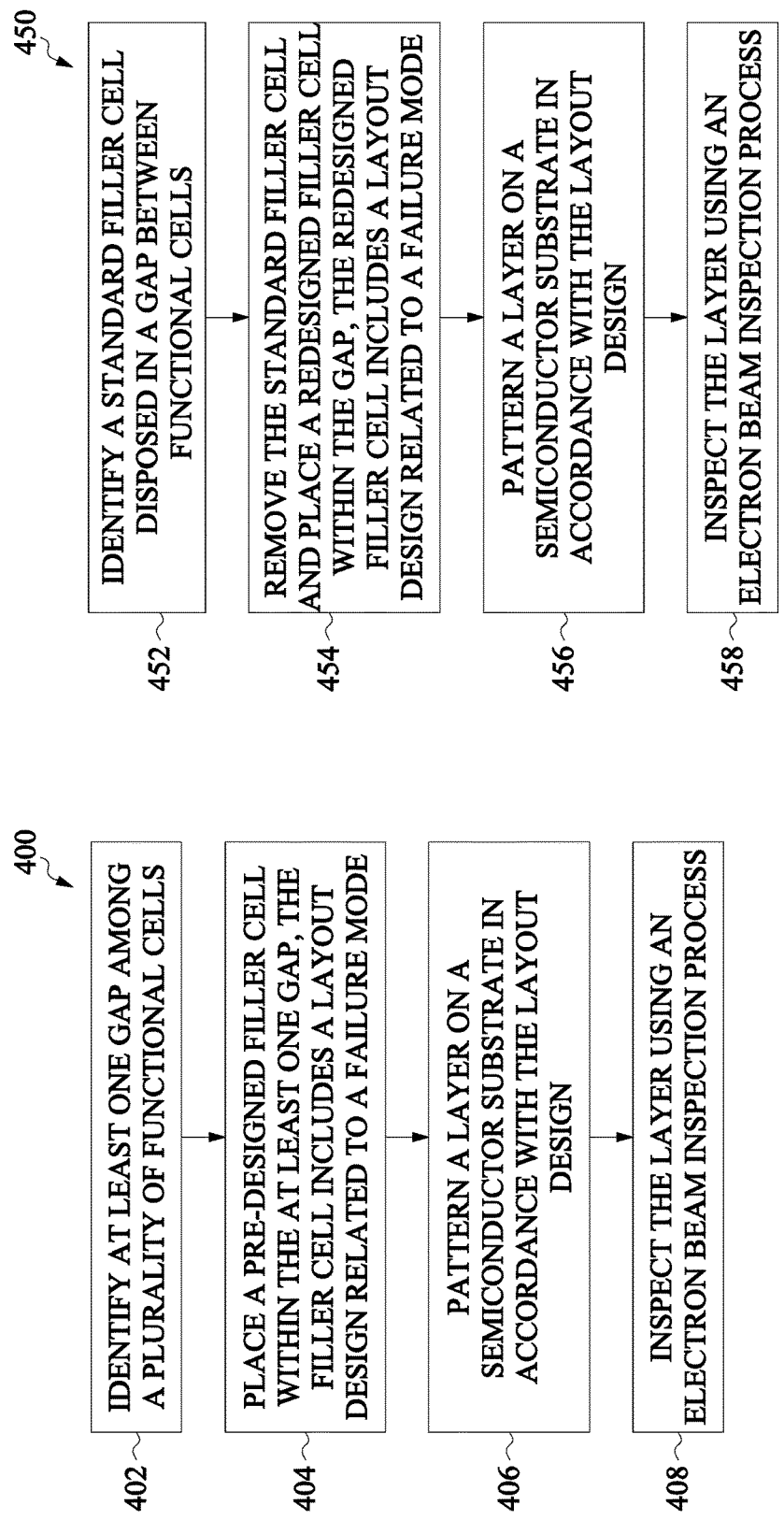
FIGS. 4A/4B illustrate flowcharts of a method 400 and 450 for inserting a redesigned filler cell into an IC layout in accordance with various embodiments.

In particular, and with reference to FIGS. 4A and 4B, illustrated therein are exemplary methods 400 and 450, respectively, for inserting a redesigned filler cell in accordance with various embodiments. By way of example, the method 400 provides a method for inserting the redesigned filler cell at a particular stage of the physical design flow (e.g., the method 300), while the method 450 provides an alternative method for inserting the redesigned filler cell at another stage of the physical design flow. Additional operations can be provided before, during, and after the methods 400 and 450, and some operations described can be replaced, eliminated, or moved around for additional embodiments of the method. It is also noted that the methods 400 and 450 are exemplary, and are not intended to limit the present disclosure beyond what is explicitly recited in the claims that follow. Various aspects of the methods 400 and 450 are described below with reference to FIGS. 5A, 5B, and 6-10.

Figure 5A:
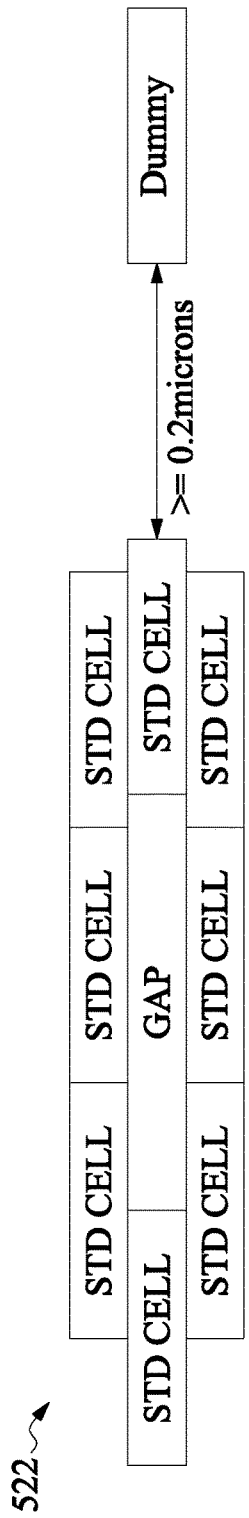
FIGS. 5A/5B illustrate portions of an IC layout, demonstrating insertion of the redesigned filler cell into the IC layout, in accordance with some embodiments.
Figure 5B:
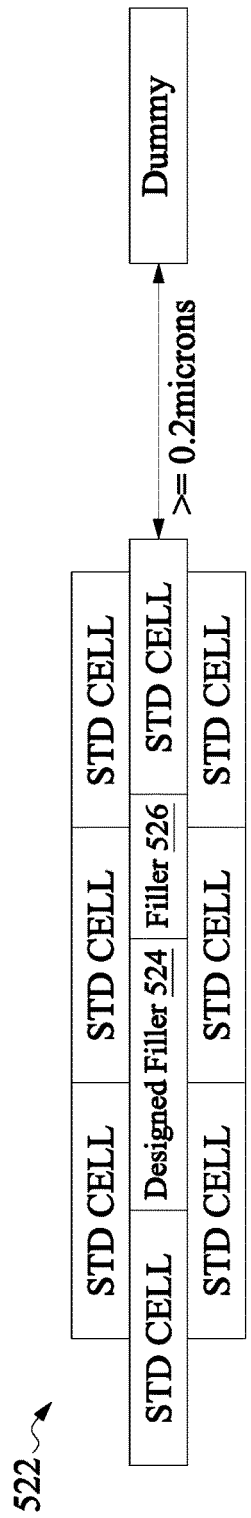

Beginning with the method 400 shown in FIG. 4A, the method 400 begins at block 402 where at least one gap is identified among a plurality of functional cells. Referring to the example of FIG. 5A, and in an embodiment of block 402, a portion of IC layout 522 is shown which includes a plurality of standard cells labeled 'STD CELL', and a gap labeled 'GAP' disposed among and/or between the standard cells. As previously noted, the standard cells, which may be referred to as a functional cell and/or functional logic cell, may include a group of transistor and interconnect structures that can provide any of a number of simple to complex circuit functions. Stated another way, the standard cells may be referred to as portions of a circuit of the IC layout 522. Gaps, such as the gap shown in FIG. 5A, may occur because it may not be possible to have 100% utilization of the layout and also due to routing congestion. FIG. 5A also illustrates a dummy cell, where in at least some embodiments, a spacing between the dummy cell and an adjacent standard cell is greater than or equal to about 0.2 microns.

The method 400 proceeds to block 404 where a pre-designed filler cell (e.g., the redesigned filler cell discussed above) is placed with the gap identified at block 402. In addition, the redesigned filler cell includes a layout design related to a particular failure mode. As previously discussed, it is desirable to fill the identified gaps for a number of reasons, such as for N-well continuity, to improve feature uniformity across a wafer, to ensure that power and ground signals are coupled to other functional cells, to reduce issues related to semiconductor yield, as well as for a variety of other reasons. In at least some conventional methods, such gaps may be filled using standard filler cells, which may include non-functional filler cells. However, in accordance with embodiments of the present disclosure, a redesigned filler cell is placed at block 404 instead of a standard filler cell. To be sure, in some embodiments, a combination of one or more redesigned filler cells and one or more standard filler cells may be placed within one or more gaps of the IC layout. Referring to the example of FIG. 5B, and in an embodiment of block 404, a redesigned filler cell 524 and a standard filler cell 526 are placed within the gap labeled 'GAP' disposed among and/or between the standard cells. As discussed in more detail below, the redesigned filler cell 524 may have a layout corresponding to an existing and/or potential failure mode. Moreover, the redesigned filler cell 524 may have a layout corresponding to an existing and/or potential failure mode within one or more of the standard cells adjacent to the redesigned filler cell 524. Stated another way, a failure mode in at least one adjacent standard cells may be first identified, and then an appropriate redesigned filler cell may be selected, where the selected redesigned filler cell has a layout corresponding to the identified failure mode in the adjacent standard cell. While the redesigned filler cell 524 is illustrated as being larger in size than the standard filler cell 526, the sizes shown are not meant to be limiting in any way. In some examples, the redesigned filler cell 524 is larger than the standard filler cell 526. In some cases, the standard filler cell 526 is not used. Thus, in some examples, the gap may be filled entirely with a plurality of redesigned filler cells which may be the same or different redesigned filler cell, for example, targeted to identifying the same or different failure mode.

Referring now to FIGS. 6-10, additional details are provided regarding the redesigned filler cell (e.g., such as the redesigned filler cell 524). In particular, FIGS. 6-10 provide examples of various layout designs which may be used, in accordance with embodiments of this disclosure, to identify one or more failure modes during a subsequent e-beam inspection process. It is understood that the failure modes discussed, as well as the associated layout designed used for a corresponding redesigned filler cell, are merely exemplary. Those of skill in the art having the benefit of this disclosure will recognize other failure modes, as well as other suitable layout designs which may be used for the redesigned filler cell.

Generally, and in various embodiments, the redesigned filler cells described herein may include designs that are customized, as needed, according to a particular type of failure mode. In particular, a variety of different types of failure modes may be more common within a certain layer (e.g., a metal layer, a VIA layer, an ILD layer, etc.) and/or within a certain circuit area, thus the pre-designed filler cells may be designed as-needed and in accordance with one or more failure modes that require closer inspection (e.g., in some cases, within a given layer and/or circuit area). By way of example, some failure modes may include a line (e.g., which may be a metal line), over-etch/under-etch, a line spacing, a line extrusion, a line pattern and/or size, or other failure modes such as a VIA spacing, pattern/size, over/under-etch, threshold voltage failure (e.g., layer defect that may cause threshold voltage to be outside of a specification value), as well as other device and/or circuit failure modes. In some cases, and depending on the type of failure mode of concern, the pre-designed filler cell may include a custom layout design having a layout pattern designed to provide an optimal e-beam inspection sensitivity (e.g., for the particular type of failure mode associated with the custom layout design). In various examples, the pre-designed filler cell may include a functional or non-functional cell.

Figure 6:
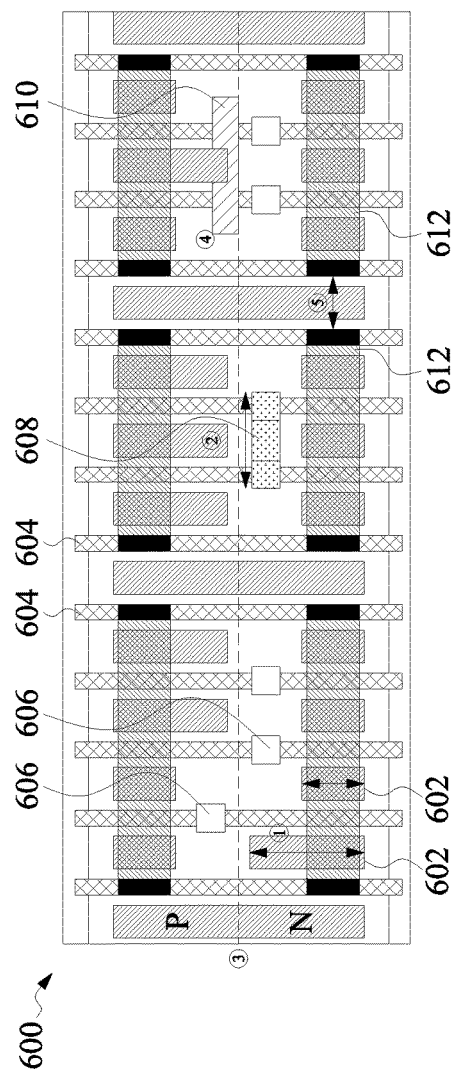

With reference now to FIG. 6, illustrated therein is a redesigned filler cell layout 600 corresponding to a first failure mode, such as a 'MD-MG' failure mode. By way of example, 'MD' may refer to a connection from a metal layer to a source/drain region, thus it may be similar to a contact metal. 'MG' may refer to a metal gate. To be sure, a material used for 'MG' may include a metal layer and/or a polysilicon layer. Thus, the 'MD-MG' failure mode may be a layout design optimized for detection of an 'MD-MG' electrical short (e.g., an electrical short between a source/drain metal and a metal gate). Referring specifically to FIG. 6, identified therein are 'MD' features 602 having a length identified as '1', poly features 604 (e.g., as for a poly-gate), poly contacts 606, a metal-on-poly 'MP' feature 608 having a length identified as '2', a p-type device region 'P' and an n-type device region 'N' identified as '3', a cut poly 'CPO' feature 610, active areas 612 having an active area space identified as '5'. It is noted once again that the features, layers, and dimensions illustrated in FIG. 6 are merely exemplary, and other features, layers, and/or dimensions may be used, for example, in accordance with a particular technology or process to identify the specified failure mode (e.g., the 'MD-MG' failure mode). It is also noted that similar features/layers shown in FIGS. 7-10 may have similar element numbers for ease of reference.

Figure 7:
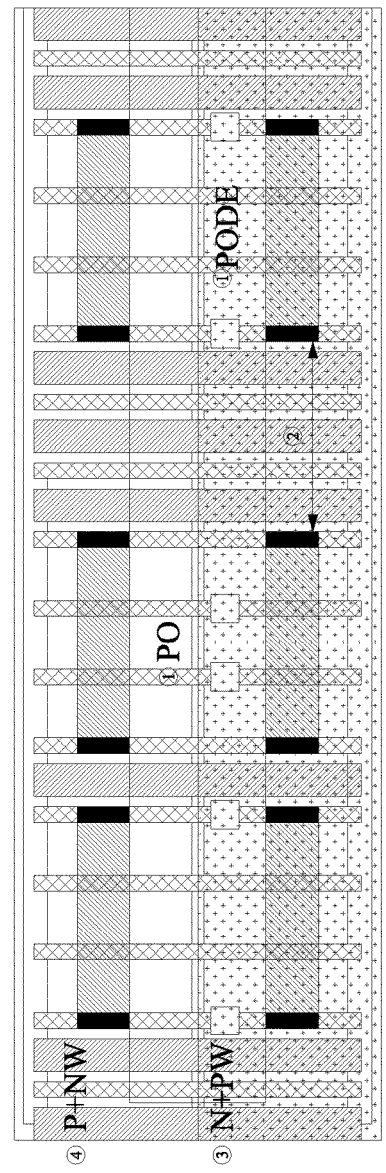

Referring to FIG. 7, illustrated therein is a redesigned filler cell layout 700 corresponding to a second failure mode, such as an 'MG Extrusion' failure mode. Referring specifically to FIG. 7, identified therein are a poly feature 'PO' identified as '1', an active area space identified as '2', an N+ p-well region identified as '3', and a P+n-well region identified as '4'. The features, layers, and dimensions illustrated in FIG. 7 are merely exemplary, and other features, layers, and/or dimensions may be used, for example, in accordance with a particular technology or process to identify the specified failure mode (e.g., the 'MG Extrusion' failure mode).

Referring to FIG. 8, illustrated therein is a redesigned filler cell layout 800 corresponding to a third failure mode, such as an 'MD under-etch' failure mode used to identify a contact under-etch failure. Referring specifically to FIG. 8, identified therein are the 'MD' features 602 having a length identified as '1', poly features 604, active areas 612, MD contacts 802, as well as other MD features, including a region without MD 'w/o MD'. The features, layers, and dimensions illustrated in FIG. 8 are merely exemplary, and other features, layers, and/or dimensions may be used, for example, in accordance with a particular technology or process to identify the specified failure mode (e.g., the 'MD under-etch' failure mode).

With reference to FIG. 9, illustrated therein is a redesigned filler cell layout 900 corresponding to a fourth failure mode, such as a 'CPO' failure mode. Thus, the layout 900 may be used as a cut poly fail monitor. Referring specifically to FIG. 9, identified therein are cut poly (CPO) features 610 having a length identified as '1', and poly features 604 'PO', as well as other features/layers. The features, layers, and dimensions illustrated in FIG. 9 are merely exemplary, and other features, layers, and/or dimensions may be used, for example, in accordance with a particular technology or process to identify the specified failure mode (e.g., the 'CPO' failure mode).

Figure 10:
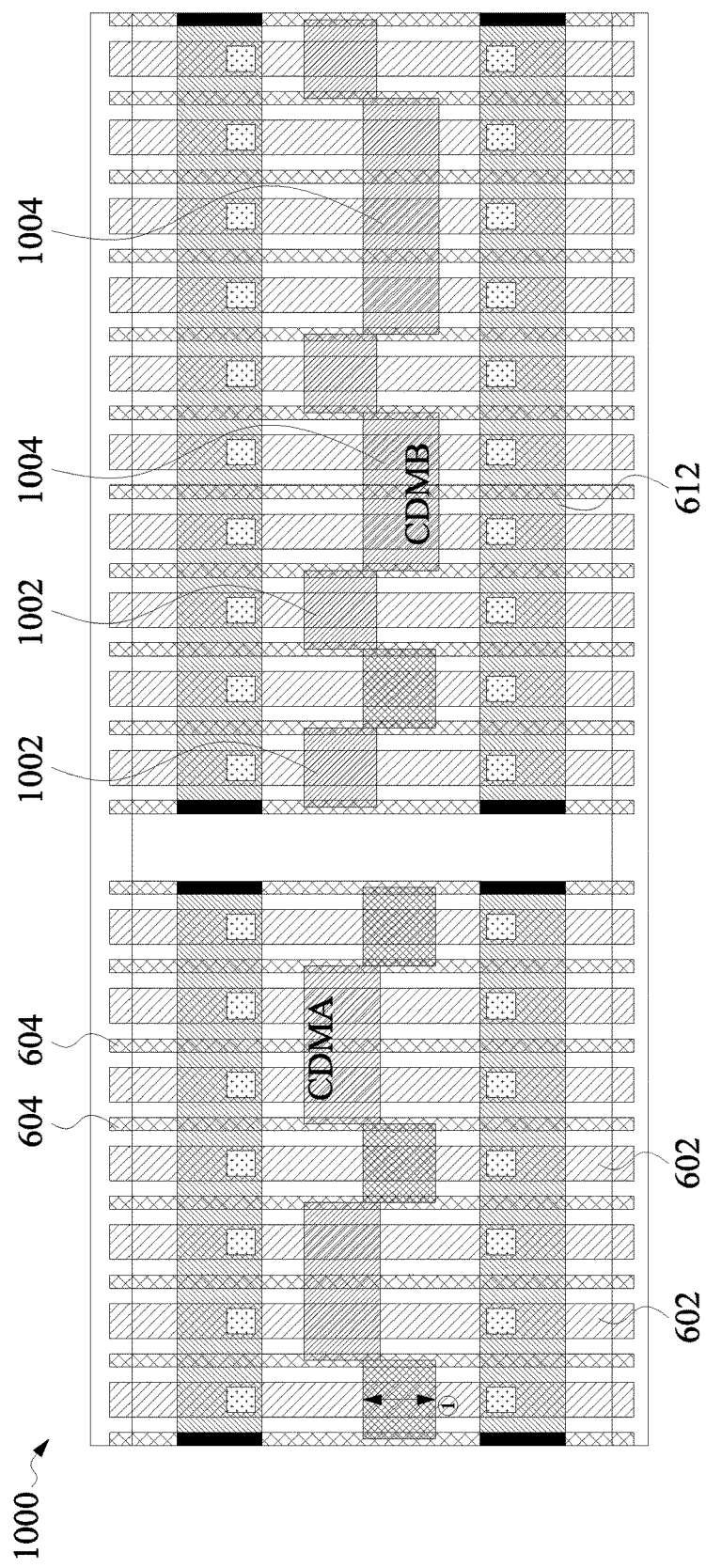

Referring to FIG. 10, illustrated therein is a redesigned filler cell layout 1000 corresponding to a fifth failure mode, such as a cut MD 'CMD' failure mode. Thus, the layout 1000 may be used as a cut MD fail monitor. Referring specifically to FIG. 10, identified therein are 'CMD' features 1002, 'CMD' features 1004 having a length identified as '1', as well as other CMD patterns/features. The features, layers, and dimensions illustrated in FIG. 10 are merely exemplary, and other features, layers, and/or dimensions may be used, for example, in accordance with a particular technology or process to identify the specified failure mode (e.g., the 'CMD' failure mode).

It is also noted that each of the redesigned filler cell layouts 600, 700, 800, 900, and 1000 provide repeated arrays (e.g., a repeated pattern array), thereby reducing analysis cycle time of cell-to-cell comparisons during e-beam inspection of a layer patterned using any of the layouts 600, 700, 800, 900, and/or 1000, and thereby improving the subsequent e-beam inspection process. In other words, the failure mode(s) for which the layouts 600, 700, 800, 900, 1000 are designed may be more rapidly detected, within a patterned layer, using e-beam inspection and the redesigned filler cell layouts 600, 700, 800, 900, and/or 1000. As previously noted, the failure modes discussed, as well as the associated layouts (e.g., the layouts 600, 700, 800, 900, 1000) used for a corresponding redesigned filler cell, are merely exemplary. In some embodiments, a custom-designed redesigned filler cell layout may be provided, for example, once information regarding a particular processing issue/failure mode is known and/or determined. In addition, placement of a redesigned filler cell (at block 404) having a layout associated with a particular failure mode may be done in such a way that the redesigned filler cell layout chosen corresponds to an existing and/or potential failure mode present in the standard cells (e.g., STD CELL) adjacent to the redesigned filler cell (e.g., the redesigned filler cell 524) placed in the gap.

The method 400 proceeds to block 406 where a layer on a semiconductor substrate is patterned in accordance with the layout design related to the particular failure mode, based on the redesigned filler cell. As discussed above, one or more masks may be fabricated that include the redesigned filler cell layout (e.g., the redesigned filler cell 524). Thereafter, the IC manufacturer 150, such as a semiconductor foundry, may use the mask (e.g., fabricated by the mask house 130) to transfer one or more mask patterns (e.g., using a photolithography and etch process), including the redesigned filler cell pattern, onto a semiconductor wafer (e.g., the production wafer 152). Generally, the redesigned filler cell layout pattern may be transferred onto any of a plurality of layers (e.g., metal, insulator, etc.) of the production wafer 152 during the manufacturing process.

The method 400 proceeds to block 408 where the patterned layer (block 406) is inspected using an e-beam inspection process. In particular, after patterning of a particular layer of a semiconductor wafer with the redesigned filler cell layout, the wafer may be inspected (e.g., by the wafer inspection 154 facility including an e-beam inspection facility). By way of example, if the wafer inspection 154 finds a defect present on the production wafer 152, the defect may be removed (e.g., by a defect removal tool), the production wafer 152 may be reprocessed, or other appropriate processing may be performed. In accordance with embodiments of the present disclosure, use of the redesigned filler cell provides for improved e-beam inspection sensitivity, increased throughput, and shorter analysis cycle time, due at least in part to the repeated arrays provided in the redesigned filler cells. Thus, embodiments of the present disclosure provide an enhanced e-beam inspection methodology.

With reference to FIG. 4B, the method 450 is substantially similar to the method 400 of FIG. 4A. Thus, for clarity of discussion, focus is given here to the differences between the methods 400 and 450. In particular, in the method 450, one or more standard filler cells may have already been used to fill the gap(s) between/among functional cells (e.g., standard cells), and the method 450 provides for removing such standard filler cells and replacing them with one or more redesigned filler cells. Thus, by way of example, the method 450 begins at block 452 where a standard filler cell disposed in a gap between functional cells is identified (e.g., by the IC design system 180). The method 450 proceeds to block 454 where the identified standard filler cell is removed and replaced by a redesigned filler cell (e.g., by the IC design system 180). The redesigned filler cell includes a layout design related to a particular failure mode, as described above. Thereafter, the method 450 may proceed to block 456 where a layer on a semiconductor substrate is patterned in accordance with the layout design related to the particular failure mode, based on the redesigned filler cell, as discussed above. The method 450 then proceeds to block 458 where the patterned layer (block 456) is inspected using an e-beam inspection process, as discussed above.

In addition, the various embodiments disclosed herein, including the methods 300, 400, and 450, may be implemented on any suitable computing system, such as the IC design system 180 described in association with FIG. 2. In some embodiments, the methods 300, 400, and 450 may be executed on a single computer, local area networks, client-server networks, wide area networks, internets, hand-held and other portable and wireless devices and networks. Such a system architecture may take the form of an entirely hardware embodiment, an entirely software embodiment, or an embodiment containing both hardware and software elements. By way of example, hardware generally includes at least processor-capable platforms, such as client-machines (also known as personal computers or servers), and hand-held processing devices (such as smart phones, personal digital assistants (PDAs), or personal computing devices (PCDs), for example. In addition, hardware may include any physical device that is capable of storing machine-readable instructions, such as memory or other data storage devices. Other forms of hardware include hardware sub-systems, including transfer devices such as modems, modem cards, ports, and port cards, for example. In various examples, software generally includes any machine code stored in any memory medium, such as RAM or ROM, and machine code stored on other devices (such as floppy disks, flash memory, or a CD-ROM, for example). In some embodiments, software may include source or object code, for example. In addition, software may encompass any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium may be any apparatus that can contain, store, communicate, propagate, or transport the program for use by or in connection with the instruction execution system, apparatus, or device. The medium may be an electronic, magnetic, optical, electromagnetic, infrared, a semiconductor system (or apparatus or device), or a propagation medium.

In some embodiments, defined organizations of data known as data structures may be provided to enable one or more embodiments of the present disclosure. For example, a data structure may provide an organization of data, or an organization of executable code. In some examples, data signals may be carried across one or more transmission media and store and transport various data structures, and may thus be used to transport an embodiment of the present disclosure.

The embodiments of the present disclosure offer advantages over existing art, though it is understood that other embodiments may offer different advantages, not all advantages are necessarily discussed herein, and that no particular advantage is required for all embodiments. By the disclosed method of enhancing e-beam inspection methodology by employing a redesigned filler cell, various shortcomings of at least some currently-employed methods are effectively overcome. For example, embodiments of the present disclosure provide a redesigned filler cell, as a replacement to a standard filler cell, where the redesigned filler cell includes a systematic design of experiments (DOE) based on existing and/or potential process failure modes (e.g., of adjacent functional/standard cells). By employing the redesigned filler cell, embodiments of the present disclosure can convert irregular logic patterns into repeated arrays, thereby providing a number of benefits. For example, at least some advantages include no additional cost in terms of chip utilization, improved e-beam inspection sensitivity (e.g., due to repeated arrays/patterns), increased throughput (e.g., due to no additional inspection time for healthy cells), and shorter analysis cycle time (e.g., due to cell-to-cell comparison which may more quickly provide a good/no-good cell determination). Thus, embodiments of the present disclosure provide an enhanced e-beam inspection methodology. Those of skill in the art will readily appreciate that the methods described herein may be applied to a variety of other semiconductor layouts, semiconductor devices, and semiconductor processes to advantageously achieve similar benefits to those described herein without departing from the scope of the present disclosure.

Thus, one of the embodiments of the present disclosure described a method for fabricating a semiconductor device including identifying at least one gap among a plurality of functional cells. In some embodiments, a pre-designed filler cell is inserted within the at least one gap. By way of example, the pre-designed filler cell includes a layout design having a pattern associated with a particular failure mode. In various embodiments, a layer is patterned on a semiconductor substrate such that the pattern of the layout design is transferred to the layer on the semiconductor substrate. Thereafter, the patterned layer is inspected using an electron beam (e-beam) inspection process.

In another of the embodiments, discussed is a method for fabricating a semiconductor device including identifying a standard filler cell disposed in a gap between a plurality of functional cells. In some embodiments, the standard filler cell is removed and a redesigned filler cell is inserted within the gap between the plurality of functional cells. In various examples, the redesigned filler cell includes a layout pattern associated with a particular failure mode. In some embodiments, a substrate layer is patterned such that the layout pattern is transferred to the substrate layer, and the patterned layer is inspected.

In yet other embodiments, discussed is an integrated circuit (IC) including a plurality of functional cells having at least one gap disposed adjacent to at least one functional cell of the plurality of functional cells and a pre-designed filler cell disposed within the at least one gap. By way of example, the pre-designed filler cell includes a layout design associated with a particular failure mode. In addition, the particular failure mode may include a potential failure mode of the at least one functional cell. In some embodiments, the layout design includes a repeated pattern array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a plurality of functional cells including at least one gap disposed adjacent to at least one functional cell of the plurality of functional cells;
   a pre-designed filler cell disposed within the at least one gap, wherein the pre-designed filler cell is associated with a particular failure mode, and wherein the particular failure mode includes a potential failure mode of the at least one functional cell; and
   a standard filler cell disposed within the at least one gap.

2. The integrated circuit of claim 1, wherein the pre-designed filler cell includes a repeated pattern array.

3. The integrated circuit of claim 1, further comprising:
a plurality of gaps disposed among the plurality of functional cells; and
a plurality of pre-designed filler cells, wherein at least one pre-designed filler cell of the plurality of pre-designed filler cells is disposed within each of the plurality of gaps and is adjacent to a particular functional cell, and wherein the at least one pre-designed filler cell is associated with a potential failure mode of the adjacent particular functional cell.

4. The integrated circuit of claim 1, wherein the plurality of functional cells define at least part of a static random access memory (SRAM).

5. The integrated circuit of claim 1, wherein the standard filler cell includes an irregular pattern.

6. The integrated circuit of claim 1, wherein the pre-designed filler cell is configured to enhance electron beam (e-beam) inspection sensitivity for the particular failure mode.

7. The integrated circuit of claim 1, wherein the particular failure mode includes at least one of an electrical short failure mode, a metal extrusion failure mode, an under-etch failure mode, an over-etch failure mode, a cut-poly failure mode, a cut-metal failure mode, a line spacing failure mode, a line pattern failure mode, and a threshold voltage failure mode.

8. The integrated circuit of claim 1, wherein the pre-designed filler cell provides well continuity between at least some of the plurality of functional cells.

9. The integrated circuit of claim 1, further comprising a dummy cell spaced at least 0.2 microns from the plurality of functional cells.

10. The integrated circuit of claim 1, wherein the plurality of functional cells and the pre-designed filler cell are disposed within a semiconductor substrate.

11. A semiconductor device, comprising:
a substrate having a patterned layer disposed thereon;
wherein the patterned layer includes a first patterned region defining at least one functional cell;
wherein the patterned layer includes a second patterned region adjacent to the first patterned region, wherein the second patterned region defines a pre-designed filler cell including a repeated pattern array, and wherein the pre-designed filler cell is associated with a failure mode of the at least one functional cell; and
wherein the patterned layer further includes a third patterned region adjacent to the second patterned region, and wherein the third patterned region defines a standard filler cell.

12. The semiconductor device of claim 11, wherein the standard filler cell includes an irregular pattern.

13. The semiconductor device of claim 11, wherein the semiconductor device includes a static random access memory (SRAM).

14. The semiconductor device of claim 11, wherein the pre-designed filler cell provides well continuity between the at least one functional cell and another functional cell.

15. The semiconductor device of claim 11, wherein the pre-designed filler cell provides at least one of a power signal and a ground signal to the at least one functional cell.

16. An SRAM circuit, comprising:
a patterned region including a plurality of functional cells, wherein the plurality of functional cells occupy a first portion of the patterned region; and
a plurality of filler cells that occupy a second portion of the patterned region different than the first portion, wherein each of the plurality of filler cells include a repeated pattern array;
at least one standard filler cell within the second portion of the patterned region; and
wherein each of the plurality of filler cells is associated with a particular failure mode, and wherein the particular failure mode of a given filler cell includes a potential failure mode of a functional cell adjacent to the given filler cell.

17. The SRAM circuit of claim 16, wherein the at least one standard filler cell includes an irregular pattern.

18. The SRAM circuit of claim 16, wherein the plurality of filler cells includes a plurality of pre-designed filler cells.

19. The SRAM circuit of claim 16, wherein the particular failure mode includes at least one of an electrical short failure mode, a metal extrusion failure mode, an under-etch failure mode, an over-etch failure mode, a cut-poly failure mode, a cut-metal failure mode, a line spacing failure mode, a line pattern failure mode, and a threshold voltage failure mode.

20. The SRAM circuit of claim 16, further comprising a dummy cell spaced at least 0.2 microns from the plurality of functional cells.

* * * * *